United States Patent [19]

Conti et al.

[11] Patent Number: 4,751,656

[45] Date of Patent: Jun. 14, 1988

[54] METHOD FOR CHOOSING REPLACEMENT LINES IN A TWO DIMENSIONALLY REDUNDANT ARRAY

[75] Inventors: Dennis R. Conti, Essex Junction; David R. Dewar, Colchester; Robert Fonseca, Essex Junction; Robert R. Wood, Milton, all of Vt.

[73] Assignee: International Business Machines Corporation, Armonk, N.Y.

[21] Appl. No.: 838,000

[22] Filed: Mar. 10, 1986

[51] Int. Cl.$^4$ .............................................. G06F 11/20
[52] U.S. Cl. ...................................... 364/488; 371/10
[58] Field of Search ............................... 364/488–491, 364/552, 468; 371/10, 21

[56] References Cited

U.S. PATENT DOCUMENTS

| | | | |
|---|---|---|---|
| 4,422,161 | 12/1983 | Kressel et al. | 371/10 |
| 4,459,685 | 7/1984 | Sud et al. | 371/10 |
| 4,460,997 | 7/1984 | Harns | 371/10 |
| 4,460,999 | 7/1984 | Schmidte | 371/10 |
| 4,586,178 | 4/1986 | Bosse | 371/10 |
| 4,627,053 | 12/1986 | Yamaki et al. | 371/10 |
| 4,628,509 | 12/1986 | Kawaguchi | 371/21 |
| 4,639,915 | 1/1987 | Bosse | 371/10 |
| 4,648,075 | 3/1987 | Segawa et al. | 371/10 |
| 4,656,610 | 4/1987 | Yoohida et al. | 371/10 |

OTHER PUBLICATIONS

Stanley E. Schuster, "Multiple Word/Bit Line Redundancy for Semiconductor Memories", IEEE Journel of Solid State Circuits, vol. sc-13, No. 5, Oct. 1978, pp. 698-703.
Teradyne
Megatest
"Testing System for Redundant Memory", 1982 IEEE Test Conf., pp. 240-244, T. Hayasaka, K. Shimortori & K. Okada.

Primary Examiner—Parshotam S. Lall
Assistant Examiner—V. N. Trans
Attorney, Agent, or Firm—Sughrue, Mion, Zinn, Macpeak, and Seas

[57] ABSTRACT

A method of assigning replacement rows and colums in a two dimensionally redundant array in which if the number of failures along a row exceeds the number of remaining redundant columns, then replacing that row with one of the redundant rows. The process is repeated in the opposite direction with the number of remaining redundant rows and columns being properly decremented. The process of reversing directions continues until the above condition is no longer satisfied.

5 Claims, 8 Drawing Sheets

| TABLE ADDRESS | X DATA | Y DATA | M MASK | F FORCE | R REPEAT | KX X REPAIR | KY Y REPAIR | LA LAST ADDRESS | |
|---|---|---|---|---|---|---|---|---|---|
| 0 | 00C | 003 | X | X |   |   | X |   | ⎫ |
| 1 | 00E | 003 | X | X | X |   |   |   | ⎬ SPARSE |
| 2 | 010 | 001 | X |   |   | X |   | X | ⎭ |
| 3 |   |   |   |   |   |   |   |   |   |
| 4 |   |   |   |   |   |   |   |   |   |
|   |   |   |   |   |   |   |   |   |   |
|   | 005 | 000 |   |   |   | X |   |   | ⎫ |
|   | 007 | 000 |   |   |   | X |   |   | ⎬ MUST FIX |
|   | 000 | 002 |   |   |   |   | X | X | ⎭ |
|   |   |   |   |   |   |   |   |   |   |
| N |   |   |   |   |   |   |   |   |   |

METHOD FOR CHOOSING REPLACEMENT LINES IN A TWO DIMENSIONALLY REDUNDANT ARRAY

BACKGROUND

The invention relates generally to redundant arrays. In particular, the invention relates to a method for deciding which failed points in the array should be corrected by a redundant row and which should be corrected by a redundant column.

In many large integrated circuits having a regular structure, such as memory chips, it has become common practice to provide redundant memory locations to correct for memory locations which have failed. In one dimensional redundancy, the redundancy extends in one direction only. For instance, if a chip is divided into rows and column, then memory locations are associated with each intersection of a row or column. Usually there is some structure associated with both the rows and columns themselves, such as word lines running along the direction of the row or a sense amplifier reading any memory element along a particular column. In one dimensional redundancy, extra rows are provided or extra columns are provided. For example, if extra columns are provided, then whatever column contains a faulty memory location is replaced by a redundant column. Once the replacement has been effected, all memory locations logically located in the faulty column are relocated in a redundant column. Thus many faultless memory locations are likely to be replaced in order to correct one failed memory location. The redundant column also includes much of the additional circuitry associated with the column. Of course, there is a fixed number of redundant columns so that, if errors are found in an excessive number of columns, the redundant columns become insufficient to correct the errors, and the chip must be rejected.

An alternative approach is two dimensional redundancy in which both redundant rows and columns are provided. This approach is particularly useful since some errors are associated with the entire row and other errors are associated with the entire column, or at least large parts thereof. For instance, a completely failed sense amplifier would incapacitate the entire row, and it is efficient to replace the failed memory locations with a single redundant row rather than using multiple redundant columns to replace all columns intersecting that row. It should be mentioned that the redundant replacement is done automatically and relies on a simple test of every memory location in the memory chip. A bit failure map is then generated which indicates which locations or bits have failed and thus need replacing.

Sometimes, however, the choice of choosing either row replacement or column replacement is not so straightforward. Some failure mechanisms will present the situation where the number of failures in one or both dimensions exceeds the number of available word lines or bit lines. In these situations, the selection must take advantage of both the redundant word lines and bit lines, but which combination of the two sets of lines is not always apparent, particularly when the selection must be done by automated equipment.

Figure 1:
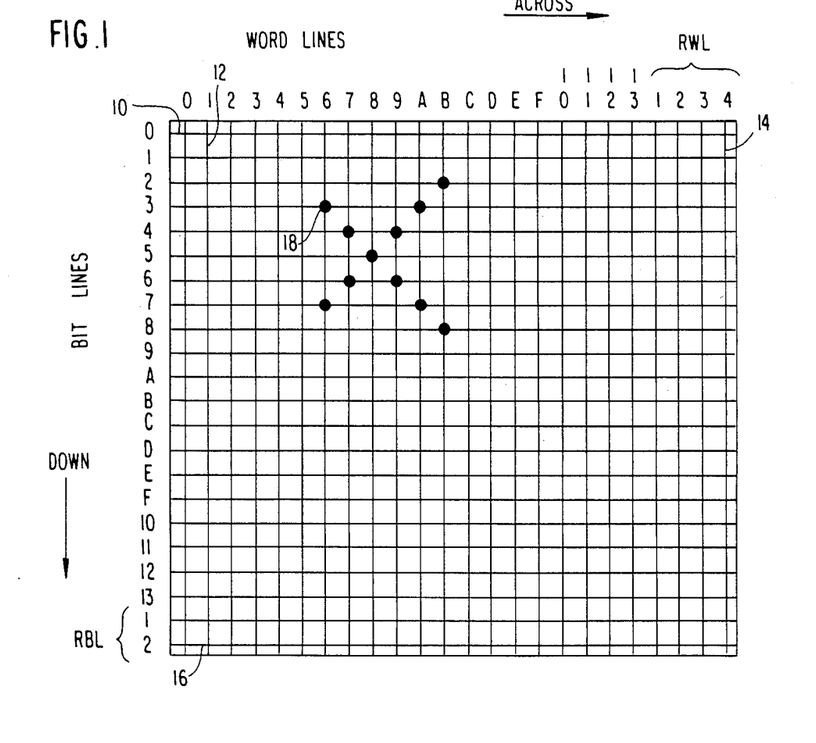
FIG. 1 illustrates both a two dimensionally redundant memory array and a bit failure map.

There is presented in FIG. 1 an example of a memory chip which has a 20×20 memory array, that is 400 memory locations or bits. A total of 20 original bit lines 10 extend horizontally and are numbered in hexadecimal notation from 0 to 13. A total of twenty original word lines 12 extend vertically and are likewise numbered in hexadecimal. It is, of course, not untypical for a memory chip to be much larger but the example of FIG. 1 is sufficient to explain the invention. Also included in the chip of FIG. 1 are four redundant word lines 14 and two redundant bit lines 16. At each intersection of a word line 12 or 14 and a bit line 10 or 16 is a memory element.

In the final stages of manufacturing a memory chip, a testing program tests each of the 400 memory elements at the intersections of the original bit and word lines 10 and 12 and stores the results of the testing in a bit failure map. For sake of simplicity, a sample bit failure map is superimposed on FIG. 1 to show a configuration of failed bits 18 associated with the original bit and word lines 10 and 12 for those failed bits 18. The purpose of the redundancy is to replace either the bit line 10 or the word line 12 associated with each failed bit 18. The replacement is made with the redundant bit lines 16 and word lines 14. However, the choice of using a redundant bit line 16 or a redundant word line 14 for a particular failed bit 18 may be difficult. There are 5 word lines 12 which have 2 fails each and 1 word line which has 1 fail. Several simple but reasonable algorithms fail to correct the bit errors indicated in FIG. 1 with the four redundant word lines 14 and two redundant bit lines 16. If the selected algorithm selects any four out of the 5 word lines which have 2 fails as word lines to repair, this device appears to be a reject since the two redundant bit lines 16 cannot correct the remaining failures. There are only two combinations of replacement assignments which will correct the bit errors of FIG. 1. The first combination is replacing the word lines 12 numbered 6, 8, A and B with the four redundant word lines 14 and replacing the bit lines 10 numbered 4 and 6 with the two redundant bit lines 16. The second combination replaces the word lines 12 numbered 7, 8, 9 and B and the bit lines numbered 3 and 7. No other combination works.

Thus the difficulty exists of developing a method which will select the proper combination of redundant rows and columns, or bit lines and word lines in the case of a memory chip, which will correct the failed elements or bits, if such correction is possible. The process must account for a generalized arrangement of failed bits 18 within the original array.

The inventors are aware of several commercially available redundancy algorithms, either in hardware or software implementations. There are two hardware implementations, the Memory Repair Analyzer available from Teradyne, Inc. of Woodland Hills, Calif. and the High Speed Redundancy Processor available from Eaton Corp. also of Woodland Hills, Calif. There are five software implementations available from Fairchild Camera and Instrument Corp. of Simi Valley, Calif., from Pacific Western Systems, Inc. of Mountain View, Calif., from Megatest Corp. of San Jose, Calif., from Tektronix, Inc. of Portland, Oreg., and the Failed Image Processing System from Accutest Corp. of Chelmsford, Mass.

Furthermore, Hayasaka et al have described both a system and an algorithm for repairing a dual dimensional redundant array in a technical article entitled "Testing System for Redundant Memory", appearing in 1982 IEEE Test Conference at pages 240–243. An interesting aspect of this paper is that they determine unrepairable conditions for the arrangement of failures before attempting to repair the chip.

SUMMARY OF THE INVENTION

Accordingly, it is an object of this invention to provide a method for assigning replacement rows and columns to replace failures indicated at the intersections of the original rows and columns.

It is another object of this invention to provide such a method which can be performed automatically for a general arrangement of failures.

It is a further object of this invention to provide such a method which corrects all failures if possible.

It is yet another object of this invention to provide all possible repair combinations.

The invention can be summarized as a method for assigning redundant rows and columns in a dual redundant array. In at least part of the procedure, lines in one direction are scanned and the number of failures on that line are computed. If the number exceeds the number of redundant lines still remaining in the opposing direction, the scanned line is a must-fix line so that it is immediately replaced. Once all the lines have been scanned in one direction, the lines in the perpendicular direction are similarly scanned. If any scan produces one or more must-fix lines, the scan must be repeated in the perpendicular direction.

DETAILED DESCRIPTION OF THE PREFERRED EMBODIMENTS

One of the central concepts of this invention is that of a must-fix row or column. It is easy to determine some conditions under which a word line or bit line must be replaced or fixed. For the case of a memory device having M redundant rows and N redundant columns, then a row is a must-fix row if it contains more than N failures. The replacement of the row fixes all the failures in that row while there are an insufficient number of columns to fix the greater than N failures in that row. Similarly, a column is a must-fix column if it contains more than M failures. This concept cannot be simply applied because the analysis needs to be sequentially performed in two directions. Furthermore, replacing a column will both reduce the number of redundant columns available and will also affect the number of failures that need to be fixed in a row replacement. The "must-fix" portion of the repair analysis process locates must-fix lines by scanning through the bit failure map. The scanning process is done by designating one axis as the scan axis and the other axis is designated as the step axis. For instance, to fix must-fix rows, the column dimension is designated as the scan axis and the rows become the step axis. The logic ripples through every column address along a row and counts the number of failures. When the number of failures exceeds the number of available redundant columns, the row address is noted as a must-fix row and is stored in the repair RAM. A counter holding the number of spare rows is then decremented to reflect the fact the one less redundant row is available.

In a first embodiment of the invention, a scan is performed along one axis with a scan limit initially set to the must-fix limit of the number of available lines in the perpendicular direction. If there are no lines meeting the must-fix criterion, then the scan limit is reduced by one and the procedure is repeated. The entire procedure is illustrated by the flow diagram on FIG. 2 for the bit line scan and on FIG. 3 for the word line scan. An explanation of its operation will use the bit failure map of FIG. 1 as an example of its use. However, for ease of illustration, only the non-zero part of the bit map of FIG. 1 is reproduced in FIG. 4.

Following compilation of the bit failure map, in a step 20, the bit line scan is begun with the scan direction scanning down the bit lines 10. In a step 22, the next word line 12 from bit lines 0 to 13 is tested and the number of failures in that word line are counted. In a test 24, the number of failures is compared against a bit scan limit. Initially, the bit scan limit is set to the number of redundant bit lines, 2 in the example. If the number of failures exceeds the bit scan limit, then a fail has been detected. In the example, the initial value of the bit scan limit is 2. Only those word lines containing greater than two failures are detected as fails. If no fail has been detected, then a test 26 determines if all the word lines have been tested. If not, the next word line is stepped to. At the end of the bit line scan 26, a test 28 is made to determine whether there have been any failures of word lines exceeding the bit scan limit. If not, a test 30 determines if both the bit scan limit and a word scan limit, to be described later, are equal to zero. If so, the memory chip is noted as being at least fixable. If both scan limits are not zero, then the bit scan limit is reduced by one in step 32 and the procedure is repeated with the reduced bit scan limit.

If the test 24 determined that there is a failure in the current word line, as would occur in the second scan of word line number 6 with the bit scan limit=1, then a test 34 determines if both a bit repair flag and a word repair flag are on. These flags will be described later but are initially reset to the off condition. Since the flags have not yet been set, a test 36 is then made to determine if there are redundant word lines available to replace the failed word line. This test 36 is performed by consulting a register containing the number of unselected redundant word lines. For the scan of word line number 6, there are redundant word lines available so that in a sep 38 the word line is tentatively saved and the associated register is incremented. This associated register would be initialized to zero in the start step 20. A test 40 is then made whether both scan limits are zero. If not, the bit line scan proceeds.

Figure 2:
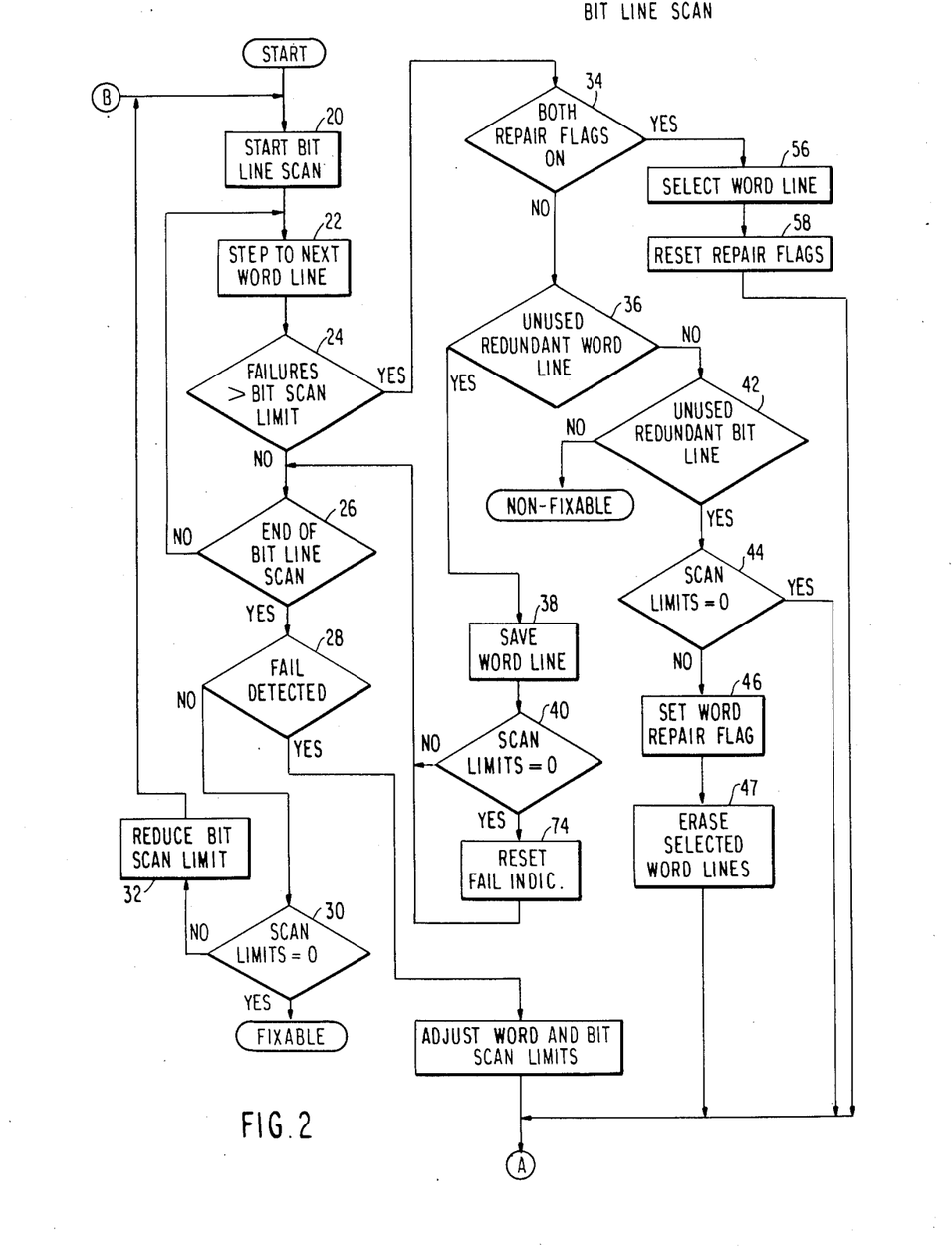
FIGS. 2 and 3 illustrate a flow diagram for a first embodiment of the invention.

In the example, the word lines number 6, 7, 9 and A would be so tentatively saved. Word line number 8, although containing one failure is not considered a fail in test 24 when the bit scan limit equals one. A fail is detected in word line number B but this detected fail does not pass test 36 since the four available redundant word lines have already been used. A test 42 is then made as to whether there are unused redundant bit lines available as determined by a test of a register of unselected redundant bit lines. If there are none available, then there is no possibility of fixing the memory chip and therefore the chip is noted as being a reject and the procedure terminates for this chip. If there are available redundant bit lines, then a test 44 tests whether both scan limits are zero. If not, in step 46, the word repair flag is set, as would be the case in the example. In any case, the execution of the bit line scan is then ended and execution of the word line scan is begun, as illustrated on FIG. 3. It should be noted that the tentative saving of the word lines number 6, 7, 9 and A in step 38 is never finalized because there is an insufficient number of redundant word lines to correct all such similar fails. At this time, in a step 47, repair data for word lines 6, 7, 8 and A is erased since the attempt did not result in a potential repair.

Figure 3:
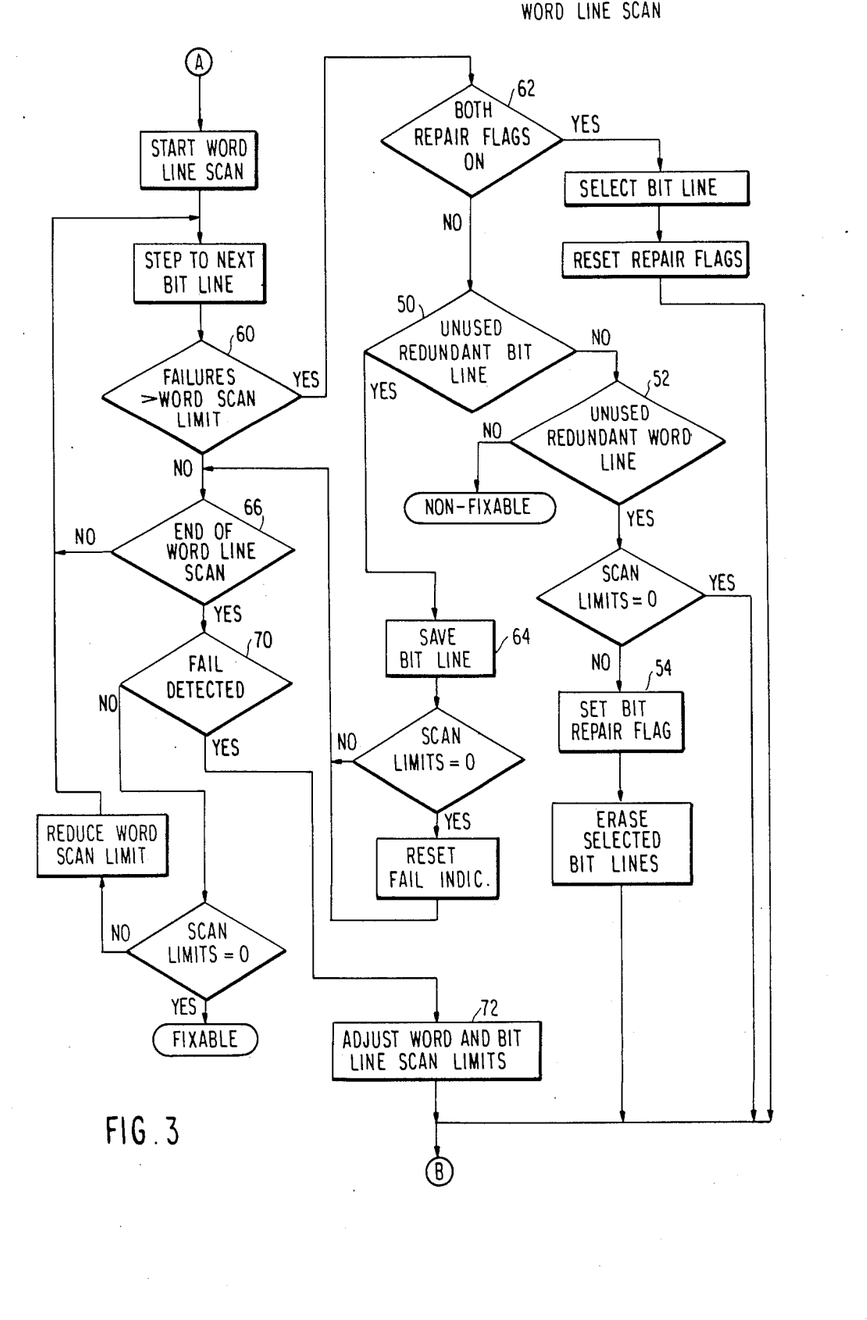
Figure 4:
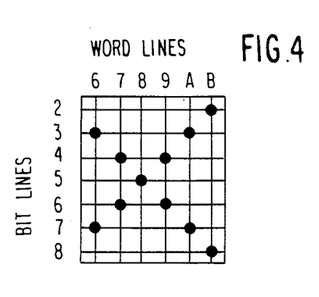
FIGS. 4, 5 and 6 illustrate reduced size bit failure maps during the execution of the algorithm of FIGS. 2 and 3.

The word line scan of FIG. 3 is completely analogous to the bit line scan of FIG. 2 with the obvious interchange of bit lines for word lines. The word scan limit is initially set to 4, the number of redundant word lines. No fails are detected until the word scan limit has been decremented to 1. On the detection of the third fail, namely for bit line number 6, a test 50 for available redundant bit lines is failed. However, a test 52 for available redundant word lines is passed since none had been selected, not just tentatively saved, in the bit line scan. As a result, in a step 54, the bit repair flag is also set so that both flags are now set. This phase of the word line scan is then completed and execution returns to the beginning of the bit line scan with the exception that the scan limits are left at their current values.

Figure 5:
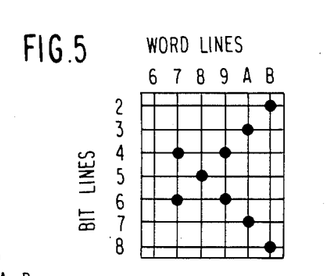

With the bit scan limit set at 1, a fail is detected in word line number 6. The test 34 for both repair flags being on is now passed and that failed word line is selected in step 56. A word line is selected by storing its address in a word line selection RAM. Simultaneously with the selection of the word line, the bit failure map is updated by removing all failures along the selected word line, as shown in the bit failure map of FIG. 5. Also the register for unselected redundant word lines is decremented by one. Then in step 58 both of the repair flags are reset and this phase of execution of the bit line scan is terminated.

Figure 6:
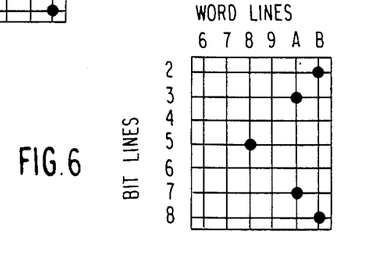

When execution returns to the word line scan, both of the scan limits are at values of 1. Both bit lines number 4 and 6 are detected by a test 60 as having fails at the word scan limit of 1. Neither repair flag is on so a repair flag test 62 is failed but there are sufficient number of available redundant bit lines in test 50 so that in a step 64 both bit lines are tentatively saved. No other bit line is detected as having a fail at this bit scan limit so that the word line scan is ended at a step 66. The register for unselected redundant bit lines is decremented by two and the bit failure map is updated, as shown in FIG. 6.

At this point in the example, the register for the unselected redundant bit lines contains a value of zero while the register for the unselected redundant word lines contains a value of three. A test 70 is made as to whether a fail indicator has been set in this word line scan by the scan limit test 60. It has been set in the example so that in a step 72 both the word line and bit line scan limits are set to zero based upon the zero value in the register for the unselected redundant bit lines. This adjustment is made because with no more redundant bit lines available, the next execution of the bit line scan must fix all remaining failures. Execution then returns to the bit line scan.

In this final bit line scan, word lines number 8, A and B are detected as having fails for which there are available redundant word lines in test 36 so that they are tentatively saved. On this final scan, the scan limit test 40 is passed so that in a step 74 the fail indicator set in the failure test 24 is reset each time. No other word lines are detected as having fails so that the scan is ended in test 26. At this point all the failures have been fixed. Then the test 28 is not passed because the fail indicator has been reset in step 74. Both of the scan limits are at zero so that the scan limit test 30 is passed and the memory chip is noted as being fixable. This completes the processing for one chip. The word and bit lines to be repaired have been saved, in the selection process, in respective word line and bit line memories (repair selection RAMs) and have not been erased.

It can be appreciated that the assignment of redundancy is divided into a number of stages. In progressive stages, the scan limits are reduced from the initial values of the first stage equal to the numbers of perpendicular redundant lines. In each stage, a scan is performed to determine if all the failures exceeding the scan limit can be fixed with the available redundant lines. If not, a similar scan is performed in the perpendicular direction. If this attempt also fails, then one failed line is replaced by a redundant line and the above process is repeated in such a manner that perpendicular lines are alternately replaced unless all lines having failures exceeding the current scan limit can be replaced by available redundant lines. Whenever this last condition is fulfilled, the lines are replaced and the associated scan limit is decremented.

Figure 7:
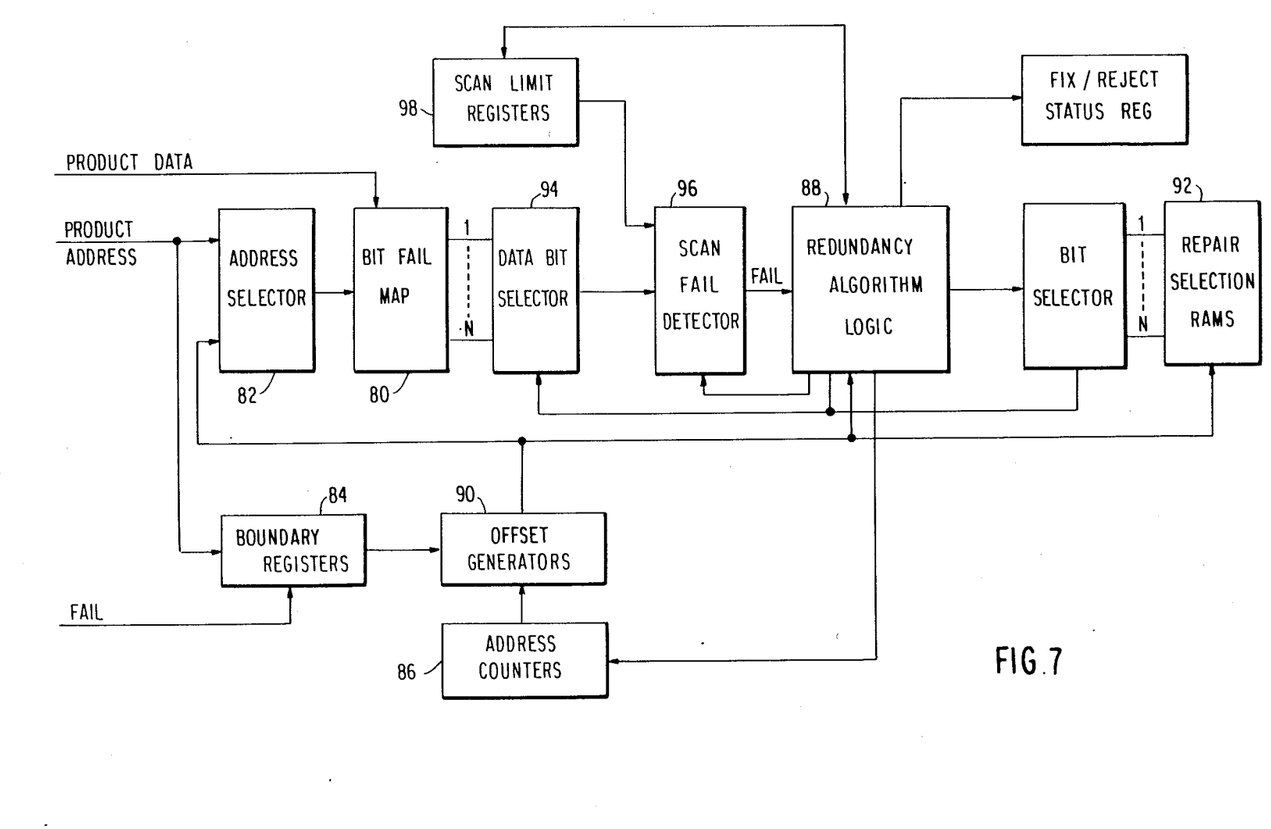
FIG. 7 is a block diagram illustrating an embodiment of an apparatus for executing the sequence of FIGS. 2 and 3.

A block diagram of the hardware which will allow the practice of the above method is shown in FIG. 7. The bit failure map is stored in a map RAM (random access memory) 80. When the memory chip is being tested, the product data is led on a data input to the map RAM 80 while the address of the memory chip is led to an address selector 82 which converts the memory chip address to the proper address in the map RAM 80. The memory chip address is also led to a set of boundary registers 84 which receives a fail signal from the testing equipment. The purpose of the boundary registers 84 is to establish upper and lower boundaries in both the rows and columns within which all failures are located. This allows the elimination of scanning of elements of the memory map which are known beforehand to contain no failures. The effect is to condense the memory map from that of FIG. 1 to the memory maps of FIGS. 4, 5 and 6. Two address counters 86 consist of two separately controlled word line and bit line counters which are reset, incremented and decremented as required by a redundancy algorithm logic 88. The outputs of the address counters 86 are offset in an offset generator 90, where the offsets are determined by the lower boundaries determined in the boundary registers 84 to produce an effective address. This effective address is modified by the address selector 82 for use in the map RAM 80 and is used, as required, by the redundancy algorithm logic 88 and repair selection RAMs 92 containing the addresses of the word lines and bit lines which should be replaced by redundant lines.

The bit failure map in the map RAM 80 becomes the data source for the redundancy algorithm logic 88. Data contained in the bit failure map is not destroyed during the execution of the redundancy algorithm and is available for further processing. The bit failure map updating, described in the method, is performed by other dynamic means upon accessing the map RAM 80.

The outputs for the bit failure map from the map RAM 80 are sent to a data bit selector 94 which routes one of the data bits at a time to the redundancy algorithm logic 88 for processing. This one data bit refers to one of multiple bit outputs from a chip. The redundancy algorithm logic 88 can process only one of the multiple outputs at a time. Once the word line and bit line repair selections have been made and the repair or reject decision has been reached, the next multiple data output will be selected. However, the data bit selector 94 supplies a column worth or a row worth of bits, as adjusted by the boundary registers, to a scan fail detector 96. The scan fail detector 96 scans the row or column presented to it and counts the number of failures, which would be the number of set elements in that row or column of the memory failure map and compares the counted number to the appropriate scan limit currently stored in scan limit registers 98. If the number of failures exceeds the scan limit, a failure signal is directed to the redundancy algorithm logic 88.

More that parallel processing for multiple output memory chips could be accomplished by replicating scan fail detector 96, the redundancy algorithm logic 88 and the scan limit registers 98. However, with a memory chip which contains common redundant lines for all data bits, only one data pass will be required since the same results will apply to all of the multiple outputs. That is, the bit failure map would be the sum of all bit failures on the multiple outputs.

The scan limit registers 98 are updated by the redundancy algorithm logic 88 which also performs the algorithm presented in FIGS. 2 and 3, with the exception of the inner scan. The redundancy algorithm 88 also provides the control and decision making functions for the supporting logic. The outputs of the redundancy algorithm logic 88 consist of word line and bit line repair selections to the repair selection RAMs 92. When multiple output bits are being separately processed, a bit selector 100 provides the inverse operation as the data bit selector 94. The repair selections RAMs 92 store the word line and bit line repair selection data. In the case of separate redundant lines for each of multiple outputs, unique data will be retained for each of the outputs. The redundancy algorithm logic 88 also sets a fix/reject status register 100, which can be set to a reject status after the repair selection RAMs 92 have been partially filled. Once a memory chip has been determined to be fixable, the contents of the repair selection RAMs 92 are used to blow the fusible links on the memory chip.

The above method is effective at repairing a memory chip with redundant lines. However, the scanning process for a large chip is time consuming and must be repeated many times in the described algorithm. Hence, the algorithm can be time consuming which is not desirable in a production testing environment. Accordingly, the invention has been modified to accommodate additional processing which tends to minimize the scanning and to arrive at an early decision if a chip is not fixable.

Figure 8:
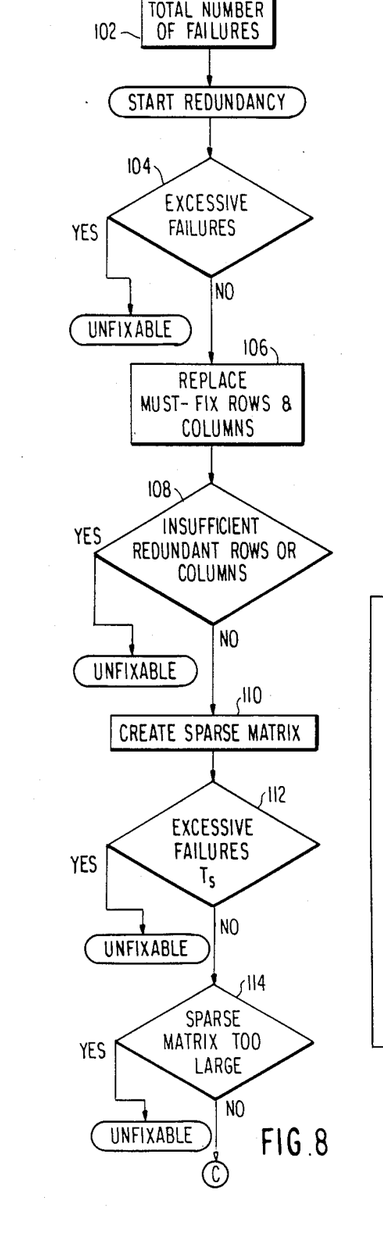
FIGS. 8 and 9 illustrate a flow diagram for a second embodiment of the invention.
Figure 9:
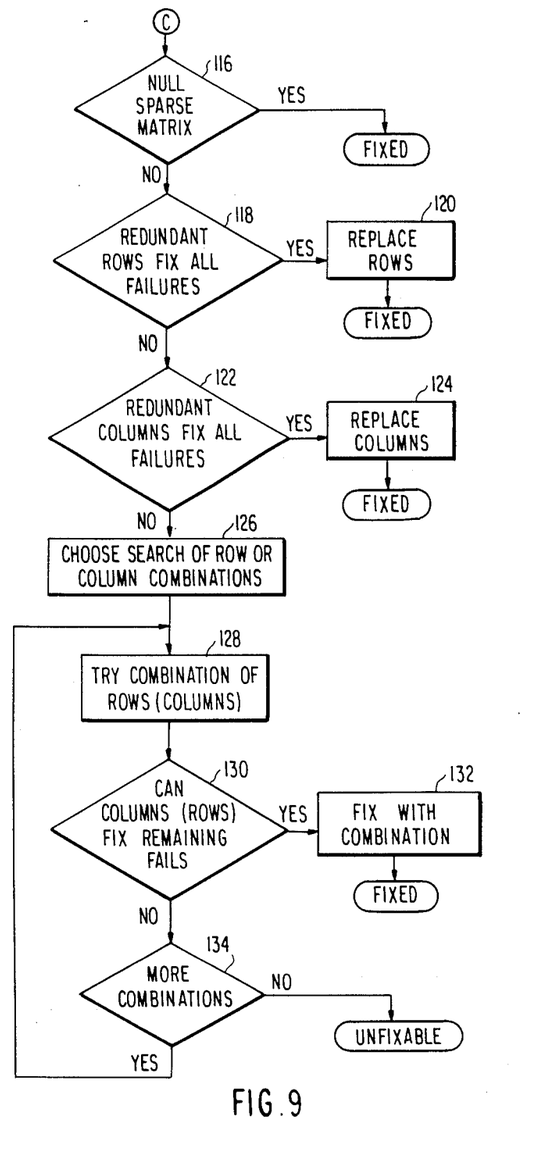

The algorithm is shown in FIGS. 8 and 9. Some terminology will be introduced at this point. The array to be fixed has m original rows and n original columns. There are M redundant rows and N redundant columns. If some of the redundant rows or columns have already been used, the number of redundant rows remaining is $P_x$ and the number of redundant columns remaining is $Q_y$. The number of failures in the i-th row is called $x_i$ and the number of failures in the j-th column is called $c_j$. Let the memory map be viewed as a matrix B of m rows and n columns. Any failure is indicated by a 1, that is, $b_{ij}=1$. Otherwise, $b_{ij}=0$.

At the start of the algorithm, the total number $T_F$ of failures is calculated in step 102. The sum can be performed while testing the device by scanning all the rows for the number of failures $x_i$ and then summing $x_i$ for all the rows. The same result can be obtained by scanning the columns for the failure sum of the set $\{c_j\}$. The maximum number of failures that can be fixed by the M redundant rows and N redundant columns occurs in the extreme case when all the n failures in each of the M replaced rows have failed and all the m failures in each the N replaced columns have failed. Thus nM failures are fixed by the M redundant rows and mN failures are fixed by the N redundant columns. However, the MMN locations at the intersections of the replaced rows and columns should be counted only once. Accordingly, the maximum number of fixable failures is $$T_R = mN + nM - MN. \tag{1}$$

Accordingly, a test 104 is made whether there are an excessive number of failures according to Equation (1), that is, whether $T_F \leq T_R$. If the test 104 indicates an excessive number of failures, the memory chip can immediately be labelled as unfixable.

If, however, there are not an excessive number of failures, there is still no guarantee that the chip is fixable since the arrangement of failures within the chip has not been taken into account. Next, the must-fix columns and rows are replaced in a step 106. The concept of must-fix columns and rows has previously been introduced. However, the criteria for must-fix rows and columns is judged against the remaining numbers $P_x$ and $Q_y$. A must-fix row occurs when $x_i > Q_y$ and a must-fix column occurs when $c_j > P_x$. These numbers $P_x$ and $Q_y$ change as redundant rows and columns are used. Every time as row is indicated as a must-fix row, then the number $P_x$ of remaining redundant rows is decremented and the must-fix test must be reapplied to the columns. Of course, a similar situation obtains as the remaining number $Q_y$ of redundant columns changes.

The scanning for the must-five procedure is done by designating one axis as the scan axis and the perpendicular axis is designated as the step axis. For instance, to find must-fix rows the column dimension is designated as the scan axis and the rows become the step axis. The logic ripples through every column address along a row and counts the number of failures. When the failure count exceeds the number of available redundant columns, the row address is flagged as a must-fix row and is stored in a repair RAM. A counter holding the number of spare rows is then decremented to reflect the fact that one less redundant row is available. When all the rows have been scanned, then the axis designations are reversed and the columns are scanned.

Every time a row or a column is designated as a must-fix row or column, the axis designations need to be changed at the completion of finding all the must-fix lines in that dimension since the use of a spare row column changes the criterion for a must-fix line in the opposing direction.

In order to reduce the lengthy scanning time, a pair of mask RAMs are used, one associated with each axis. The contents of the mask RAMs indicate whether the corresponding row or column contains a failure. This allows rows and columns which do not contain failures to be skipped during the scan. The contents of these RAMs are updated during the must-fix process to reflect any changes caused by a fix.

A test 108 is made if there are an insufficient number of redundant rows and columns to fix the must-fix rows and columns. This is really a test as to whether either $P_x$ or $Q_y$ has been decremented to a negative number. If the test 108 indicates an insufficient number of redundant rows or columns, then the chip can be immediately labelled as unfixable.

If, however, $P_x \geq 0$ and $Q_y \geq 0$, then there are sufficient number of redundant rows and columns to fix the must-fix rows and columns. In that case, a sparse matrix A is created from the matrix B of the original memory map in a step 110. Any row that has been replaced in step 106 is zeroed out in the matrix B. Similarly, any column that has been replaced is zeroed out. Then any row having only zeroes is removed from the matrix B, that is, the dimension of the matrix B is reduced. Similarly, any column having only zeroes is removed. The thus modified and reduced matrix B is the sparse matrix A having a rows and b columns. The sparse matrix A has no totally zero row and no totally zero column. Also, since all must-fix rows and columns have been removed from the sparse matrix, the number of failures in any row or columns is no more than the number of remaining redundant columns or rows in the orthogonal direction, $Q_y$ or $P_x$. If orthogonal line scans are performed on the sparse matrix A to produce the number of failures $x'_i$ in the i-th row of the sparse matrix and the number of failure $y'_j$ in the j-th column, then $0 < x'_i \leq Q_y$ and $0 < y_j \leq P_x$.

Figure 10:
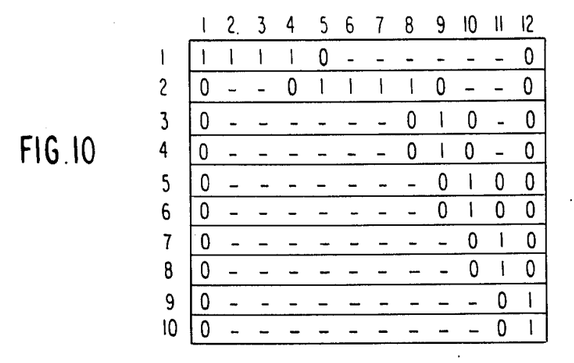
FIG. 10 is an example of a sparse matrix with the maximum number of failures.

There is a maximum number $T_{RR}$ of failures that can be fixed by the remaining numbers $Q_x$ and $P_y$ of redundant rows and columns. FIG. 10 gives an example of such a sparse matrix A with the maximum number $T_{RR}$ of failures for $P_x = 2$ for the number of remaining redundant rows and $Q_y = 4$ for the number of remaining redundant columns and for which the number of rows $a = 10$ and the number of columns $b = 12$. Each of the first two rows have the maximum number $Q_y$ of failures and each of the last four columns have the maximum number $P_x$ of failures. If any of the locations at the lower left indicated a failure, it would be impossible to fix them with the available number $P_x$ of redundant rows and the available number $Q_y$ of redundant columns. To generalize the above situation, it is seen that the number $P_x$ of redundant rows can each fix $Q_y$ failures while the number $Q_y$ of redundant columns can each fix $P_x$ failures. Thus the maximum number of fixable failures in the sparse matrix A is $$T_{RR} = 2P_xQ_y \tag{1}$$

The total number $T_S$ of failures is found by summing the set of the row scan counts $\{x_i\}$ over the a rows or alternatively by summing the set of the column scan counts $\{c_j\}$ over the b rows. Then a test 112 is made as to whether there are an excessive number of failures in the sparse matrix A, that is whether $T_S$ fails the test $T_S \leq T_{RR}$ or $$T_S \leq 2P_xQ_y \tag{3}$$

If the test 112 indicates an excessive number of failures, then the chip is labelled as unfixable. Otherwise, the chip is still potentially fixable.

Once again viewing FIG. 10, it should be obvious that the number a of rows in the sparse matrix A is limited to the sum of the number of available redundant columns plus one, times the number of available redundant rows, that is, $$a \leq (Q_y + 1)P_x \tag{4}$$

Similarly, the number b of columns is restricted to
$$b \leq (P_x + 1)Q_y \tag{5}$$

The numbers a and b can be generated simultaneously with the generation of the sparse matrix A. Then in a test 114, both of the Equations (4) and (5) are applied to determine if the sparse matrix is too large. If it is too large, the chip is labelled as unfixable.

It should be noted that the various operations and tests upon the sparse matrix A could have been performed upon the matrix B of the memory map with proper masking of the rows and columns that had been replaced. Also, since many chips with the same numbers M and N or redundant lines are being sequentially tested, the values of $P_x$ and $Q_y$ are bounded. As a result, the tests of Equations (3), (4) and (5) can be performed by creating tables or matrices addressed by the values $P_x$ and $Q_y$, thus saving arithmetic operations.

If the test 114 does not indicate an excessive number of failures, then three trivial solutions to the replacement are investigated. It may be that the replacement of the must-fix rows and columns fixed all the failures so that the sparse matrix A is a null matrix. This completed solution is expressed by the condition $$T_S = 0 \tag{6}$$

A test 116, as shown in FIG. 9, is made to determine if Equation (6) is satisfied. If it is, the chip has already been fixed.

Another trivial solution is the situation where the remaining number $P_x$ of redundant rows is sufficient to fix all the failures. This solution would impose a limit on the number a of rows in the sparse matrix A, namely, $$a \leq P_x \tag{7}$$

A test 118 is made to determine if Equation (7) is satisfied so that the redundant rows can fix all failures. If so, the rows of the sparse matrix A are all replaced in a step 120 and the chip is completely fixed.

The final trivial solution is whether the redundant columns can fix all the failures, which is expressed by the condition $$b \leq Q_y \tag{8}$$

A test 122 of Equation (8) is made and if it is satisfied, then in step 124, all the columns of the sparse matrix A are replaced.

At this point, the preliminary testing is completed. It may be that the chip has been labelled as unfixable or a trivial solution has been found and the chip is fixed. The must-fix rows and columns have been replaced for partially fixed chips. However, the difficult task remains of finding non-trivial solutions if that is required. It is of course possible that none of the above tests would have labelled a chip as unfixable but that no solution is possible and the chip is unfixable. The algorithm presented for the first embodiment could be adapted to finding the non-trivial solutions of replacing both rows and columns. However, many of the rows and columns are likely to have already been replaced. Furthermore, many of the unfixable chips have already been identified so that it is less likely to hereafter identify a chip as unfixable. Therefore, it is considered feasible to perform an exhaustive search of all possible combinations of the remaining redundant rows and columns to find one combination which will fix all the failures.

The number of ways that $P_x$ redundant rows can replace the a rows in the sparse matrix A is given by the expression for binomial coefficients $$\text{comb}(a, P_x) = a!/(P_x!(a-P_x)!). \quad (9)$$

A similar expression for columns is $$\text{comb}(b, Q_y) = b!/(Q_y!(b-Q_y)!). \quad (10)$$

Once a combination of rows, for example, has been selected for testing, the selection of the combination of columns can be done more methodically without having to resort to testing all combinations. As a result, an initial choice in a step 126 has to be made whether to exhaustively search the rows or the columns. Since the binomial expressions of Equations (9) and (10) can yield extremely large values when both of the parameters are large, the choice of the direction of exhaustive searching is determined by which of the Equations (9) and (10) is smaller. For the example of the sparse matrix of FIG. 10, there are 45 combination of searching rows but 495 combinations of searching columns. Hence, row searching would be chosen.

If exhaustive row searching is chosen, then the methodology for finding the combinations of replacement rows and columns is as follows. Replace in a step 128 a number $P_x$ of the a rows of the sparse matrix A with zero values, that is, zero out the a rows. The choice of which $P_x$ rows would be arranged in an ordered arbitrary sequence. With the failures in the chosen rows zeroed out, the sparse matrix is scanned along the columns to find all the numbers $\{c'_j\}$ of failures along each column. If a number $(b-Q_y)$ or more of the members of $\{c'_j\}$ are zero, as shown in test 130, then a repair solution has been found for the non-zero values of $\{c'_j\}$. That is, there is a maximum number $Q_y$ of non-zero columns that can be replaced by the remaining redundant columns and the chip is fixed by step 132. If the chosen combination of replacement rows does not pass the column scan test, then a test 134 is made as to whether there are other combinations of replacement rows and another combination of replacement rows is attempted. If none of the comb(a, $P_x$) number of combinations works, then there is a final determination that the chip is not repairable.

The methodology for searching the columns follows the above reasoning with a reversal of directions.

Figure 11:
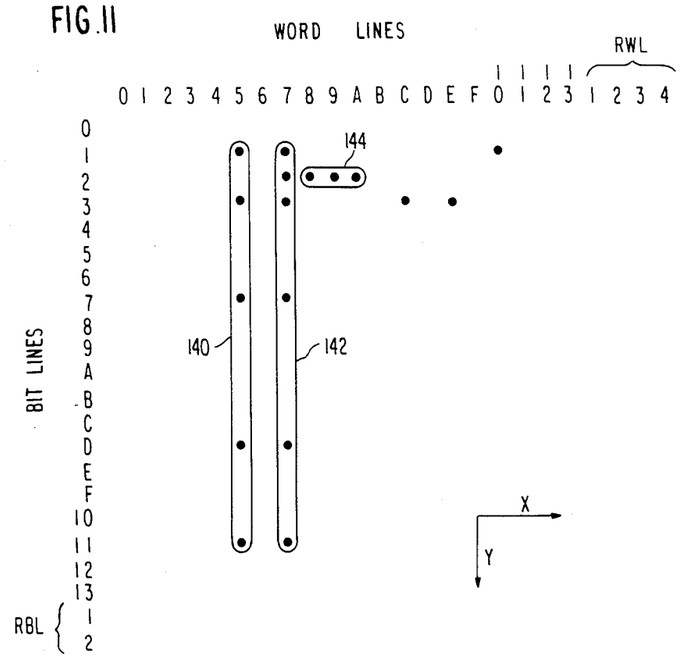
FIG. 11 illustrates another example of a bit failure map.
Figure 12:
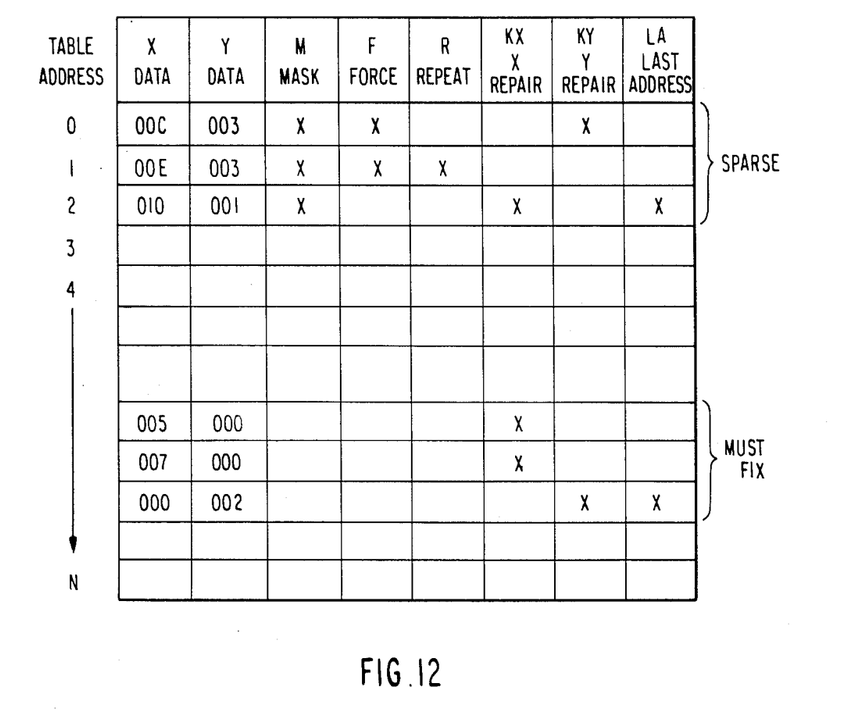
FIG. 12 illustrates the structure of a repair table produced by the invention.

The algorithm just described is somewhat functional in its presentation. Furthermore, in actual application it may be worthwhile to simplify some of the tests and processing. A more practical algorithm will be presented with reference to the bit failure map of FIG. 11. This figure also shows the four redundant word lines and the two redundant bit lines although these redundant lines are not properly part of the bit failure map. In the must-fix analysis, two mask RAMs are associated respectively with the rows and columns and indicate which rows and columns do not have any failures. These failure-free rows and columns are not scanned. Two counters keep track of the remaining numbers $P_x$ and $Q_y$ of redundant lines. Two groups 140 and 142 of failures are fixed by redundant word lines and one group 144 is fixed by a redundant bit line. There are sufficient numbers of redundant lines for these replacements. Then a repair table is generated, as shown in FIG. 12. The repair table and the sparse table are physically the same table. The sparse table does not include the repair information KX and KY that is needed for the repair table. The table must be zeroed out before data is entered. Near the bottom of the repair table in a must-fix area are entered the must-fix rows and columns. Every must-fix column is entered with an X data for its column address and a zero value for its Y data. For columns, an X keep/fix bit KX is set to indicate that the data in the X data column is the important value. Similarly, every must-fix row is entered with a Y data for its row address and zero value for its X data. A Y keep/fix bit KY is set for rows. The bottom-most entry has a last address bit LA set in order to delimit the table.

If there are failures still remaining, which will be called sparse failures, the sparse failures are separately stored in individual entries in the repair table beginning at the top. The column address is entered as the X data and the row address is entered as the Y data. As with the must-fix process, the scan time can be reduced by examining the contents of the mask RAM and bypassing any row without remaining failures. Again, the bottom-most sparse failure entry has its last address bit LA set to delimit the subsequent scanning of the repair table.

During the generation of the sparse failure part of the repair table, the logic counts the number of rows and columns having sparse failures. These values are compared to the maximum numbers of rows and columns in the sparse matrix A according to Equations (4) and (5). Also the number of sparse failures are counted during the storing of the sparse failures and the test of Equation (3) is performed to determine if there are an excessive number of sparse failures.

The solution of the sparse matrix stored in the repair table will be performed by three interacting algorithms called the lock level, sparse level and mask level. In summary, the lock level sequentially chooses or forces all possible combinations of some number of replacement rows (or columns). The sparse level then attempts to complete the remaining solution for the combination provided by the lock level. The sparse level uses an algorithm somewhat similar to that of the first embodiment. The mask level determines if the solution of the sparse level corrected all the errors.

The lock level logic will select either the X data field or the Y data field based on which dimension contains the least number $P_x$ or $Q_y$ of remaining redundant lines. This is a considerably simpler test than that of Equations (9) and (10). In the example, there is only one remaining redundant bit line so that the Y data field is chosen as the scan dimension. Assume that there are four sparse failures A, B, C and D. The lock level logic will first select a line associated with the chosen data field of A for repair and will then hand over control to the sparse level. If no solution is found by the sparse level, the lock level then chooses sparse failure B. If the forcing of a solution for a single line does not yield a solution, then a second level lock level is entered in which two lines are forced simultaneously. Table 1 shows the sequence in which the sparse failures are selected by a lock level logic which has four lock levels.

TABLE 1

| LOCK LEVEL 4 | LOCK LEVEL 3 | LOCK LEVEL 2 | LOCK LEVEL 1 |
|---|---|---|---|
| | | | A |
| | | | B |
| | | | C |
| | | | D |
| | | A | B |
| | | A | C |
| | | A | D |
| | | B | C |
| | | B | D |
| | | C | D |
| | A | B | C |
| | A | B | D |
| | A | C | D |
| | B | C | D |
| A | B | C | D |

The lock level logic will force a combination until either all combinations are exhausted or a solution has been found. In some situations, it is desirable to find all possible solutions so that the lock level will sequentially force all possible solutions.

When the lock level forces a combination, it notes in the repair table what sparse failures are corrected by that combination. For the sparse failures which have been forced, the lock level inserts a keep/fix bit KX or KY (KY in the example, since the lock level is processing the Y data, a force bit F and a mask bit M. The mask bit indicates that the failure has been corrected. The lock level then looks at the data field (the Y data in the example) to determine if other failures have the same data field value as the forced sparse fail. This would be the situation where forcing one line will fix multiple failures. These additional failures are marked with the mask bit M and a repeat bit R. The keep/fix bit is not set since the forced failure will cause the correction of the common line.

Once the lock level has forced a combination and duly marked the affected failures, control is turned over to the sparse level logic, which attempts the remaining solution.

The sparse level operates somewhat similarly to the algorithm of FIGS. 2 and 3. The sparse level begins scanning the dimension opposite to that chosen by the lock level, so that in the example the sparse level begins by scanning the X data beginning at the first entry. Any entry having a set mask bit M is skipped since it has been otherwise repaired. When the first address is found which does not have a set mask bit M, the X data field in the example, for that entry is save and the mask bit M for that entry is set. A failure counter is initialized to one. This value of the data field is then compared to the data in each succeeding entry which does not have a set mask bit M. Each time a match is found, the mask bit M is set and a failure counter is incremented. When the value of the failure counter equals the number of remaining redundant lines in the opposing direction, a keep/fix bit will be set for the last qualifying entry. The choice of the KX or KY keep/fix bit will be determined by which data field is being scanned. The number of remaining redundant lines in the fix dimension will be then decremented by one. It is noted that there cannot be more than this number of failures since they would have been caught in the previous must-fix analysis or a prior execution of this procedure. With one line having been replaced, another unmasked X data entry is selected for comparison with the remaining entries. Another unmasked X data entry is also selected if the selected one did not produce the fail criterion. In either case, the mask bits must be reset if the failure criterion was not met.

This process continues until one of two conditions has been met. First, if all the redundant lines in both dimensions have been used, then control is immediately turned over to the mask level logic. Secondly, if there are no more combinations of sparse failures which meet the fall criterion, then the axes are complemented and the sparse level scanning continues for the opposite dimension. As long as at least one line has been replaced during the scan of a given axis, the logic will continue to alternate from the X and Y axes effecting repairs.

The mask level logic simply checks to determine if all sparse failures have been fixed. The logic looks at the mask bits for all entries. If every entry has a set mask bit M, then they have all been repaired so that the present settings of the repair table indicates the solution. However, if an entry does not have the mask bit set, a failure continues to exist and the sparse level has failed to find a solution. In the latter case, all the mask bits set by the sparse level are reset and control is returned to the lock level where a different combinations of lines will be forced.

It is not unusual to have memory chips that have multiple parallel data outputs, sometimes referred to as DOs. The procedure described above must be repeated for each of the DOs if each DO has separately assignable redundant lines.

Figure 13:
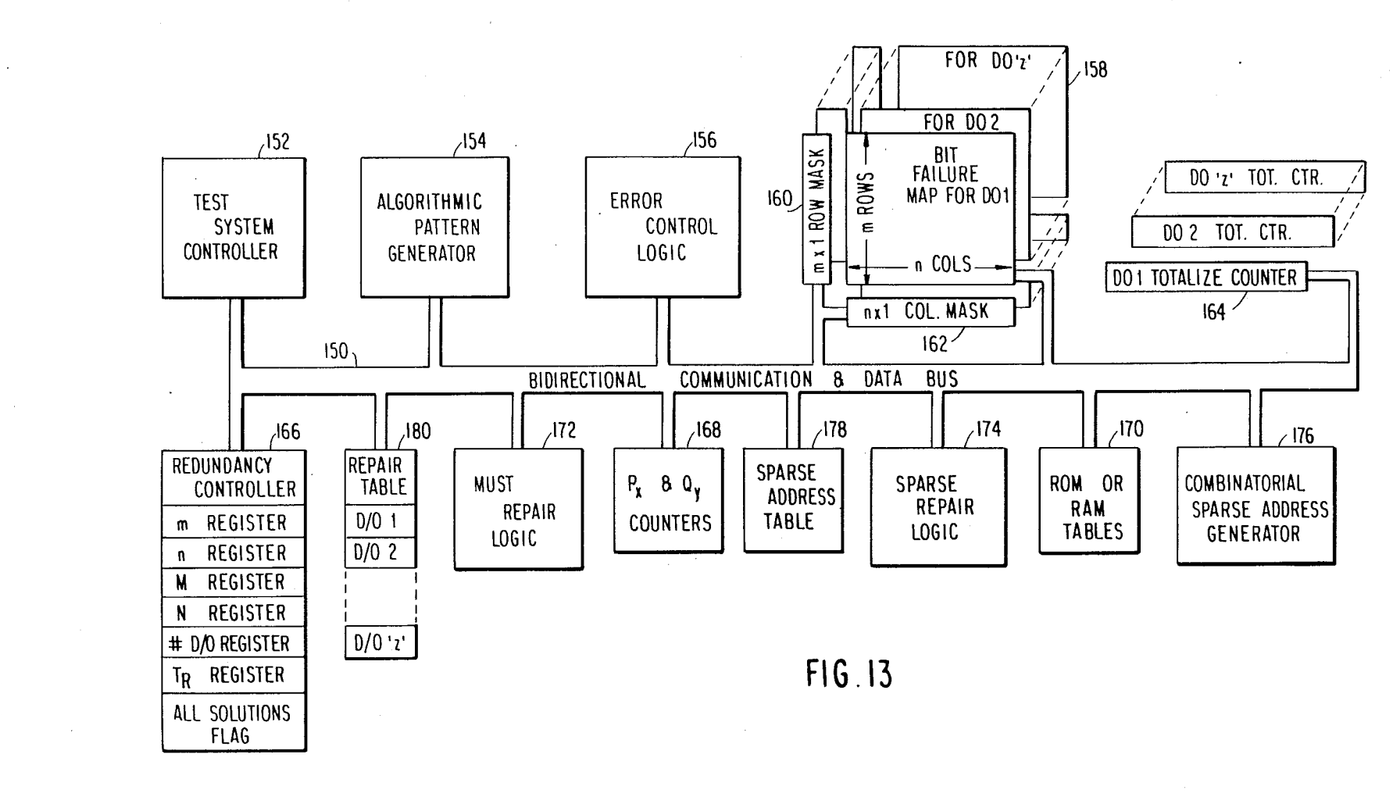
FIG. 13 is a block diagram illustrating an embodiment of an apparatus for executing the sequence of FIGS. 8 and 9.

An apparatus that can implement the algorithm of FIGS. 8 and 9, even as modified by the subsequent discussion, is shown in FIG. 13. Various components are connected to a high speed bidirectional communication and data bus. At the start of the testing a test system controller (TSC) 152 controls the bus 150. The test system controller 152 in cooperation with an algorithmic pattern generator 154 and an error control logic 156 perform function tests upon the memory chip being evaluated in order to generate the bit failure map. The bit failure map is stored in a memory 158 having z separate planes for each of multiple DOs. The addressing of the bit failure map passes through a row mask RAM 160 and a column mask RAM 162. As each memory bit failure is detected, a bit is set in the row mask 169 and in the column mask 162 corresponding to the failing address. Also a totalize counter 164 is incremented for each unique address that failed. The totalize counter 164 is replicated for each of the z DOs.

At the end of chip testing, the test system controller 152 loads into registers within a redundancy controller 166 the dimensions m and n of the memory under test and repair, the numbers M and N of the redundant rows and columns, the number of DOs and the maximum number $T_R$ of repairable failures. An all solutions flag is set if all solutions rather than just one solution is desired. The numbers M and N are also used to initialize $P_x$ and $Q_y$ counters 168. ROM tables 170 are preprogrammed for the values of Equations (3), (4) and (5), which are then accessed by the current values of the $P_x$ and $Q_y$ counters 168. Once this initialization has been completed, the test system controller 152 turns control of the bus 150 over to the redundancy controller 166. The redundancy controller 150 is hard wired in combinatorial logic to perform the repair determination algorithm of FIGS. 8 and 9. However, the must-repair algorithm is hardwired in a separate must-repair logic 172 and the sparse repair algorithm is hardwired in a separate sparse repair logic 174. A combinatorial sparse address generator 176 is used to force the solutions at the lock logic level and a sparse address table 178 is used for address comparison at the sparse logic level. A repair table 180 is divided into separate sections for the multiple DOs and at the completion of the repair algorithm will contain the repair solution. As mentioned earlier, the sparse address table 178 and the repair table 180 may be physically the same.

At the conclusion of the repair algorithm, the redundancy controller 166 flags the test system controller 152 to resume control of the bus 150. Then, the test system controller 152 would log the repair results contained in the repair table 180 to an unillustrated data file and then begin testing the next memory chip.

An important feature of the apparatus of FIG. 13 is that exclusive of the test system controller 152, all the components are implemented in combinatorial logic which is both fast and inexpensive.

What we claim is:

1. A method for assigning redundant lines in a two dimensional array having at least one redundant line in a first direction and at least one redundant line in a second direction perpendicular to said first direction and having a first plurality of original lines in said first direction and a second plurality of original lines in said second direction, the intersections of said original lines in said first and second directions defining elements, comprising the steps of:
   (a) determining which of said elements are failures;
   (b) scanning along a selected original line sequentially selected from said original lines in said first direction to determine the number of failures in said selected line;
   (c) determining if the number of failures in said selected line exceeds the total number of remaining redundant lines in said second direction; if the number of said failures in any said first selected line exceeds the total number of remaining redundant lines in said second direction, then
   (d) replacing each said exceeding selected line with a redundant line in said first direction, wherein said replacing corrects all of said failures in said replaced line,
   (e) decrementing the total number of remaining redundant lines in said first direction, and
   (f) repeating steps (b) through (e) with an interchange of said first and second directions before step (b); and if steps (b) through (f) do not correct all said failures, then executing following steps (g) through (j):
   (g) masking all remaining failures in a selected set of a selected number of original lines in a selected one of said two directions and decrementing the number of remaining redundant lines in said selected direction by said selected number, said selected number being initially set to one;
   (h) determining if all failures not masked in step (g) can be corrected by the remaining redundant lines in said first and second directions by a method comprising the step of comparing the number of failures in an original line in a direction other than said selected direction with the number of remaining redundant lines in said selected direction;
   (i) if in step (h), it has been determined that all said non-masked failures cannot be corrected, then repeating steps (g) and (h) for another selected set of said selected number of said original lines in said selected direction; and
   (j) if in steps (g) through (i), it has been determined that all said non-masked failures cannot be fixed, then repeating steps (g) through (i) for said selected number being increased by one until said selected number is greater than the number of remaining original lines in said selected direction containing failures.

2. A method as recited in claim 1, further comprising the step of:
   comparing a total number of failures with the maximum number of failures fixable by said redundant lines in said first and second directions.

3. A method as recited in claim 1, wherein following the operation of step (f) the number of original lines in said first direction containing failures and not replaced in step (d) is compared with the product of the number of remaining redundant lines in said first direction times the sum of one plus the number of the remaining redundant lines in said second direction to determine if there are an excessive number of failures remaining to be corrected.

4. A method as recited in claim 1, further comprising the steps performed following the operation of step (f) of:

5. A method as recited in claim 1, wherein in step (g) if the remaining number of redundant lines in one direction is less than the remaining number of redundant lines in another direction, then said selected direction is said one direction in which said less remaining number of redundant lines extend.

* * * * *